(12) United States Patent
Bhakta et al.

(10) Patent No.: US 7,349,932 B2
(45) Date of Patent: Mar. 25, 2008

(54) HIGH PERFORMANCE FIR FILTER

(75) Inventors: Bhavesh G. Bhakta, Richardson, TX (US); Sridhar Ramaswamy, Plano, TX (US); Robert F. Payne, Allen, TX (US); Song Wu, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 691 days.

(21) Appl. No.: 10/777,590

(22) Filed: Feb. 12, 2004

(65) Prior Publication Data
US 2005/0182805 A1    Aug. 18, 2005

(51) Int. Cl.
  *G06F 17/15*    (2006.01)
(52) U.S. Cl. .......................................................... 708/5
(58) Field of Classification Search .................... 708/3, 708/5
See application file for complete search history.

(56) References Cited
U.S. PATENT DOCUMENTS

| | | | | |
|---|---|---|---|---|
| 4,316,258 A | * | 2/1982 | Berger ........................... | 708/3 |
| 4,751,666 A | * | 6/1988 | Gillingham .................... | 708/3 |
| 5,353,244 A | * | 10/1994 | Peters et al. ................... | 708/3 |

* cited by examiner

*Primary Examiner*—Tan V. Mai
(74) *Attorney, Agent, or Firm*—Alan K. Stewart; W. James Brady; Frederick J. Telecky, Jr.

(57) ABSTRACT

A filter includes a tap multiplication circuit and a tap digital-to-analog ("DAC") unit coupled to the tap multiplication circuit. Further, a plurality of clocks are provided that control timing associated with the tap multiplication circuit and that permit one tap multiplication to be output while another tap multiplication is being computed for a 1/N rate implementation.

6 Claims, 4 Drawing Sheets

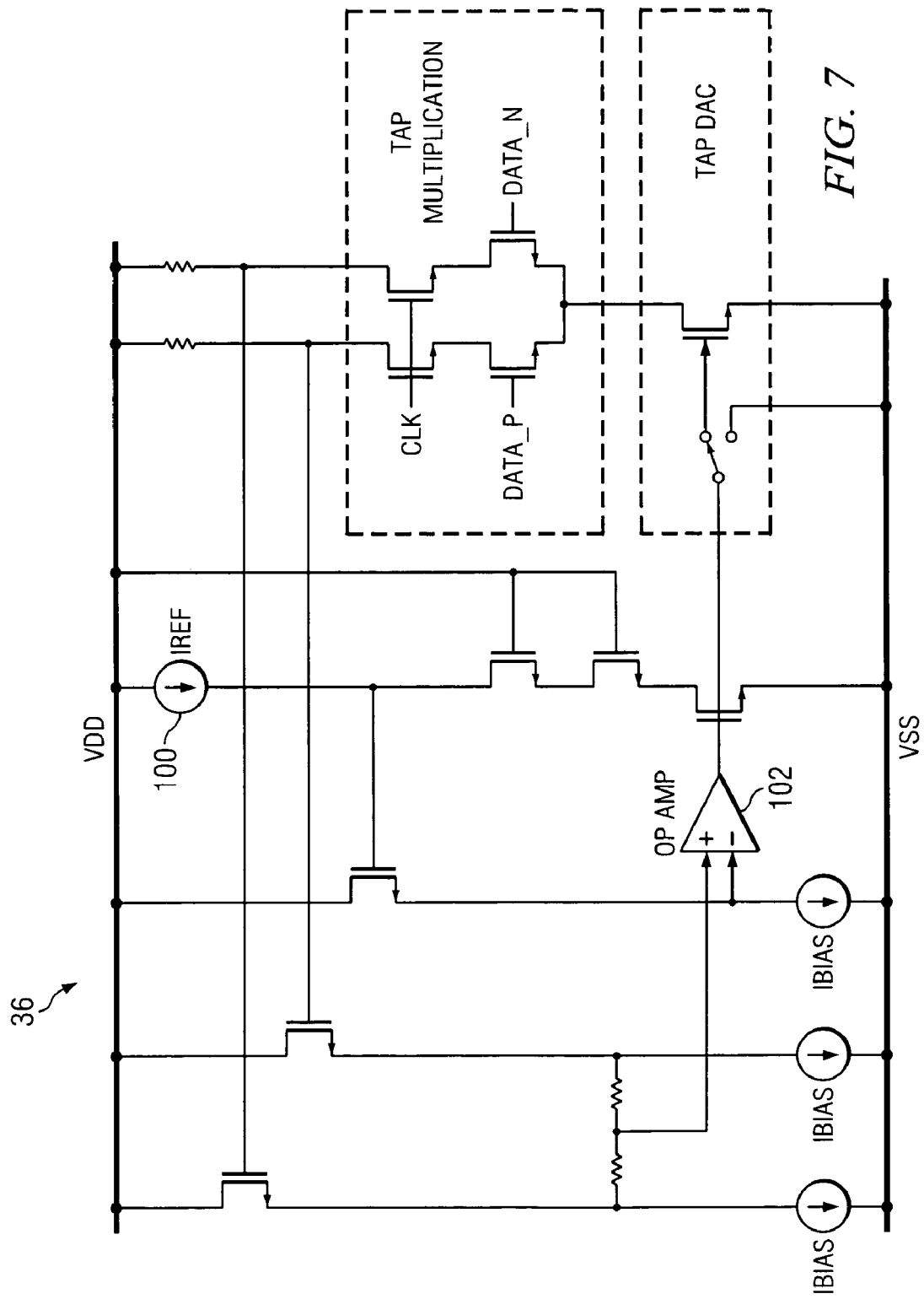

HIGH PERFORMANCE FIR FILTER

BACKGROUND OF THE INVENTION

1. Technical Field

The present subject matter relates generally to filters and more specifically, to high performance finite impulse response ("FIR") filters.

2. Background Information

Many electronic systems use finite impulse response ("FIR") filters for signal processing. Full-rate implementations of such filters and their associated electronic systems are generally limited by the speed of the tap multiplication units in a typical FIR filter. High speed, low voltage FIR filter implementations are desirable particularly, but without limitation, in the area of high speed data communications.

BRIEF SUMMARY

In accordance with at least one embodiment of the invention, a filter comprises a tap multiplication circuit and a tap digital-to-analog ("DAC") unit coupled to the tap multiplication circuit. Further, a plurality of clocks are provided that control timing associated with the tap multiplication circuit and that permit one tap multiplication to be output while another tap multiplication is being computed for a 1/N rate implementation.

NOTATION AND NOMENCLATURE

Certain terms are used throughout the following description and claims to refer to particular system components. As one skilled in the art will appreciate, various companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to." Also, the term "couple" or "couples" is intended to mean either an indirect or direct connection. Thus, if a first device couples to a second device, that connection may be through a direct connection, or through an indirect connection via other devices and connections.

BRIEF DESCRIPTION OF THE DRAWINGS

For a more detailed description of the preferred embodiments of the present invention, reference will now be made to the accompanying drawings, wherein:

FIG. 7 shows a preferred embodiment of the replica bias circuit of FIG. 2.

DETAILED DESCRIPTION OF THE PREFERRED EMBODIMENTS

The following discussion is directed to various embodiments of the invention. Although one or more of these embodiments may be preferred, the embodiments disclosed should not be interpreted, or otherwise used, as limiting the scope of the disclosure, including the claims, unless otherwise specified. In addition, one skilled in the art will understand that the following description has broad application, and the discussion of any embodiment is meant only to be exemplary of that embodiment, and not intended to intimate that the scope of the disclosure, including the claims, is limited to that embodiment.

Figure 1:
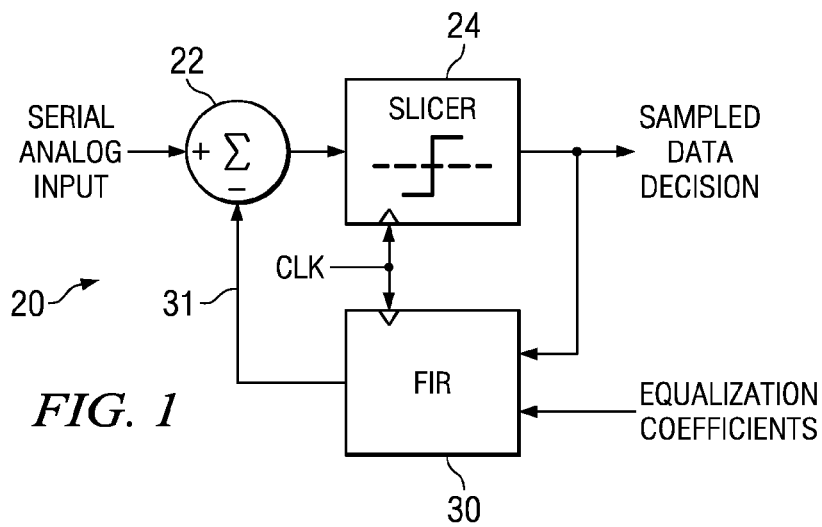
FIG. 1 shows a portion of an exemplary data communications receiver employing an FIR filter in accordance with the preferred embodiments of the invention.

As noted above, FIR filters can be used in a wide variety of applications and the present disclosure is not limited to any particular application. One exemplary application, however, is in a data communication receiver, particular receivers that incorporate equalization to combat inter-symbol interference ("ISI"). FIG. 1 shows an exemplary embodiment of at least a portion of such a data communication receiver 20. As shown, the receiver 20 comprises a summer 22, a slicer 24, and an FIR 30. An analog serial input data stream is provided to the summer. Decision feedback equalization techniques cancel incoming ISI through the subtraction of ISI estimates from the received input data stream. Thus, the slicer 24 determines the logic state of each incoming bit. The FIR filter 30 receives one or more equalization coefficients and multiplies the coefficients by the sampled data decisions to generate a feedback signal 32 to the summer 22. The feedback signal 31 is subtracted from the input data stream to cancel the affects of ISI. In addition to use in data communication receivers, FIR filters can be used in data communication transmitters. In such a transmitter, the FIR filter can be used to modify the transmitted pulse shape to combat pre-cursor and post-cursor ISI. The transmitted data can be driven either by the FIR filter itself or by a linear amplifier following the FIR filter. Data communication receivers and transmitters are exemplary only of many uses for FIR filters.

Various conventional types of FIR filters are serial in nature meaning that each filter tap uses and processes a previous decision feedback signal after that signal is fully used and processed by a preceding tap. In accordance with the preferred embodiments of the invention, the FIR filter disclosed herein incorporates parallel processing, as well as differential current switching based on binary inputs and tap current summation across a resistor to output an analog voltage. As a result, the filter achieves higher speed, lower voltage, and lower noise operation than many conventional types of FIR filters.

Figure 2:
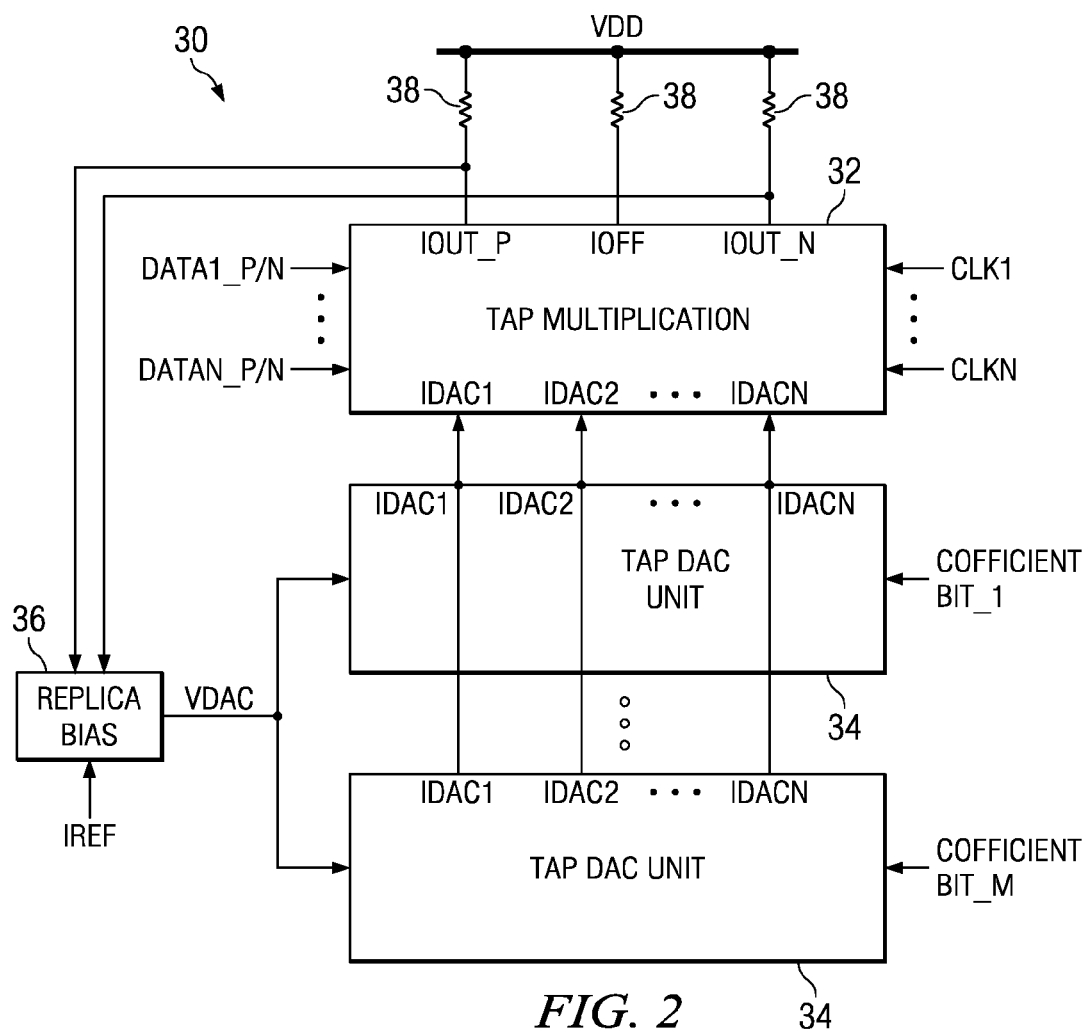
FIG. 2 depicts a preferred embodiment of the FIR filter of FIG. 1 and includes one or more tap multiplication circuits, one or more tap digital-to-analog ("DAC") units, and a replica bias circuit.

In general, the preferred FIR filter 30 disclosed herein comprises one or more taps and memory elements. FIG. 2 shows a single tap circuit implementation of filter 30. As shown, the filter comprises a tap multiplication circuit 32, one or more tap digital-to-analog conversion ("DAC") units 34, and a replica bias circuit 36. Output signals from the filter are provided by the IOUT_P and IOUT_N signals which, via resistors 38, are pulled high to voltage $V_{DD}$. The IOUT_P and IOUT_N signals also are provided to the replica bias circuit 36. A plurality of clocks (CLK1 ... CLKN, for a 1/N rate implementation) are provided to the tap multiplication circuit 32. The input data (DATA1_P/N ... DATAN_P/N) is also provided to the tap multiplication circuit. For binary signaling, multiplying tap coefficients and data simplifies to differential current switching where the magnitude of the current reflects the tap coefficient value. Thus, each tap DAC unit 34 converts an input coefficient bit (COEFFICIENT BIT_1 . . . COEFFICIENT BIT_M, where M corresponds to the number of bits in the coefficient) to a corresponding current (IDAC1, IDAC2, . . . ,IDACN). Each IDAC1 current source among the various tap DAC units 34 are tied together thereby summing their currents. The same is true for the other IDAC currents, IDAC2, . . . , IDACN. Any noise on the $V_{DD}$ voltage causes unwanted changes in the coefficient IDAC currents. The replica bias circuit 36 counters this effect to maintain the coefficient currents relatively unchanged despite noise on $V_{DD}$.

Figure 3:
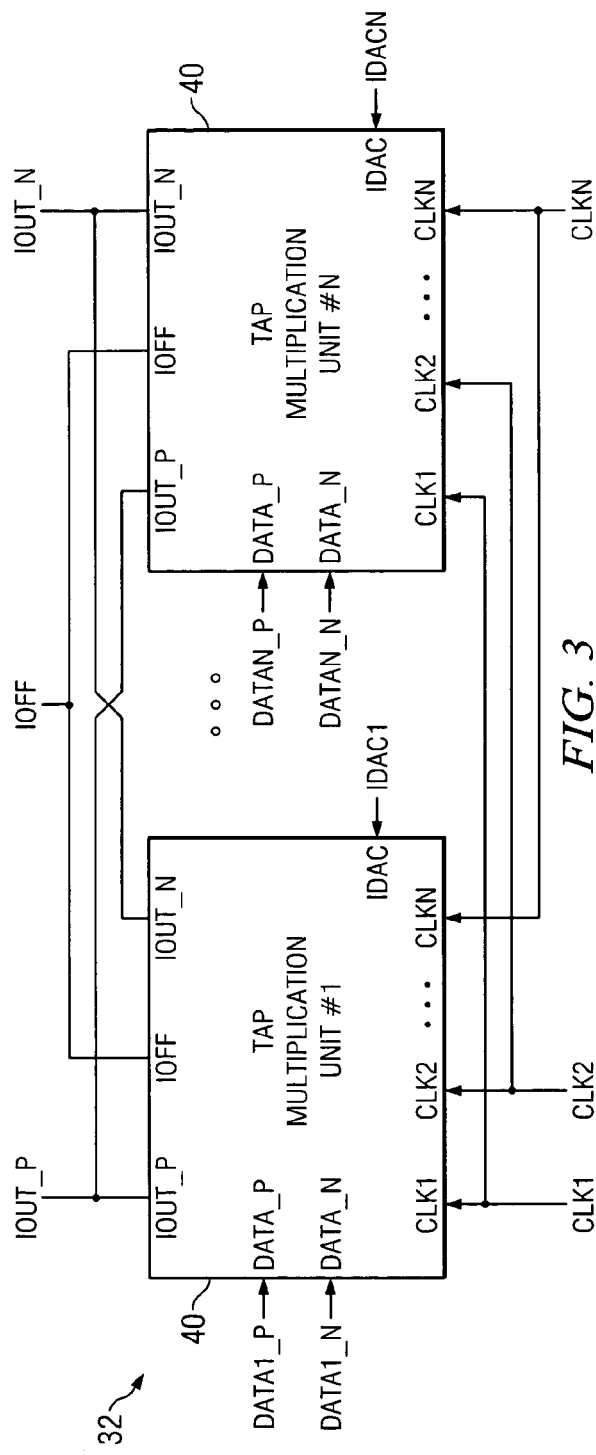
FIG. 3 shows a preferred embodiment of the tap multiplication circuit of FIG. 2 and includes a plurality of tap multiplication units.

FIG. 3 shows a preferred embodiment of the tap multiplication circuit 32. As shown in FIG. 3, the tap multiplication circuit 32 comprises one or more tap multiplication units coupled together. In accordance with the preferred embodiments, the tap multiplication circuit 32 comprises N tap multiplication units 40, each one preferably identical to the others. Further, each tap multiplication unit 40 is driven by N non-overlapping clocks (CLK1 . . . CLKN) and associated data (DATA1_P/N . . . DATAN_P/N). By non-overlapping, it is meant that only one clock is high at a time. Except at clock switching events, only one tap multiplication unit 40 at a time outputs current at the IOUT_P and IOUT_N branches. While one of the tap multiplication units 40 actively outputs the tap multiplication value, the other tap multiplication units preferably pre-compute their coefficient values. In this way, the parallel processing is implemented and the speed of the filter is increased.

The clocks serve as the gating mechanism between the pre-computed values and the tap multiplier output leading ultimately to a shorter "clock-to-Q" value. Unfortunately, the other tap multiplication units 40 may generate noise during their pre-computation phase which may detrimentally affect the active tap multiplication unit by way of cross-talk noise. To shield the tap multiplication output from such cross-talk noise, the output current from the tap multiplication units undergoing pre-computation is steered through the IOFF signal branch and away from the presently active tap multiplication unit.

Figure 4:
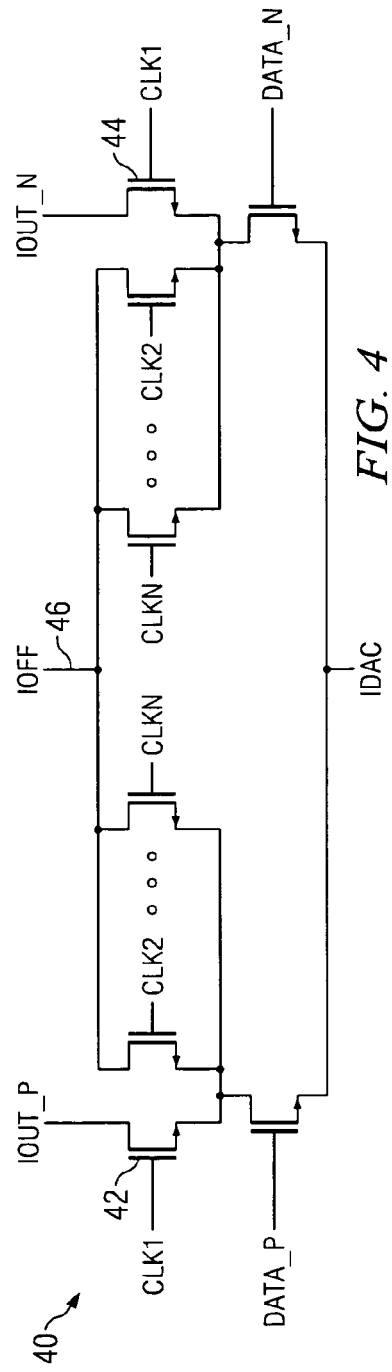
FIG. 4 shows a preferred embodiments of a tap multiplication unit.

FIG. 4 shows a preferred embodiment of a tap multiplication unit 40. As shown, the unit provides the tap current IOUT_P/N only when CLK1 is high thereby turning on transistors 42 and 44. When CLK1 is low, one of the other clocks (CLK2, CLK3, . . . , CLKN) is high thereby steering the IDAC current through the IOFF branch 46. Current steering enables fast switching by avoiding large voltage excursions caused by completely turning currents on and off.

Figure 5:
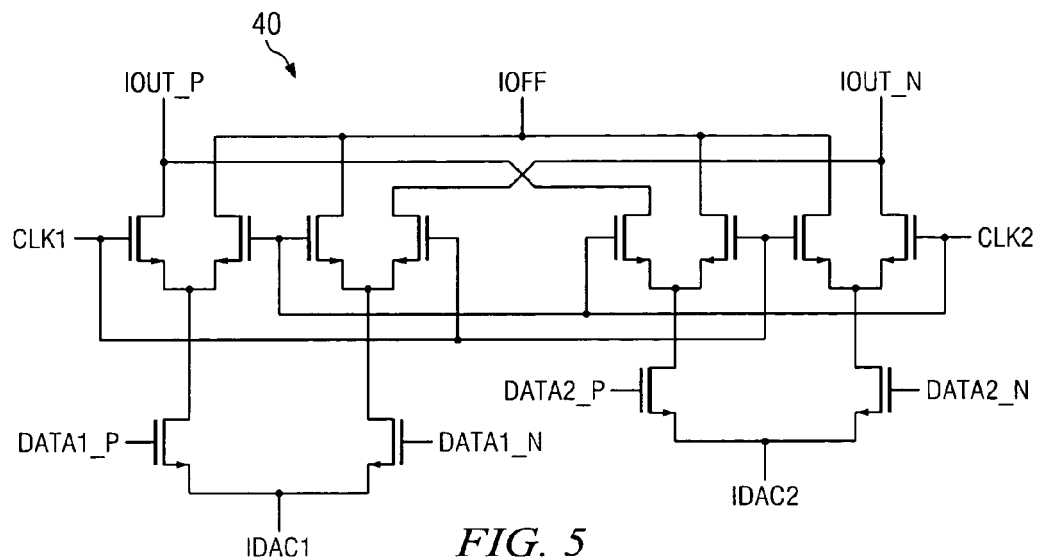
FIG. 5 shows an embodiment of an FIR filter in accordance with a preferred embodiment and implements a half-rate FIR filter.

FIG. 5 illustrates an exemplary embodiment in which the filter's tap multiplication unit 40 is implemented as a half-rate (i.e., N equals 2), tap multiplication unit. Clocks CLK1 and CLK2 preferably are complementary common mode logic ("CML") clocks running at half the symbol rate of the incoming data stream.

Figure 6:
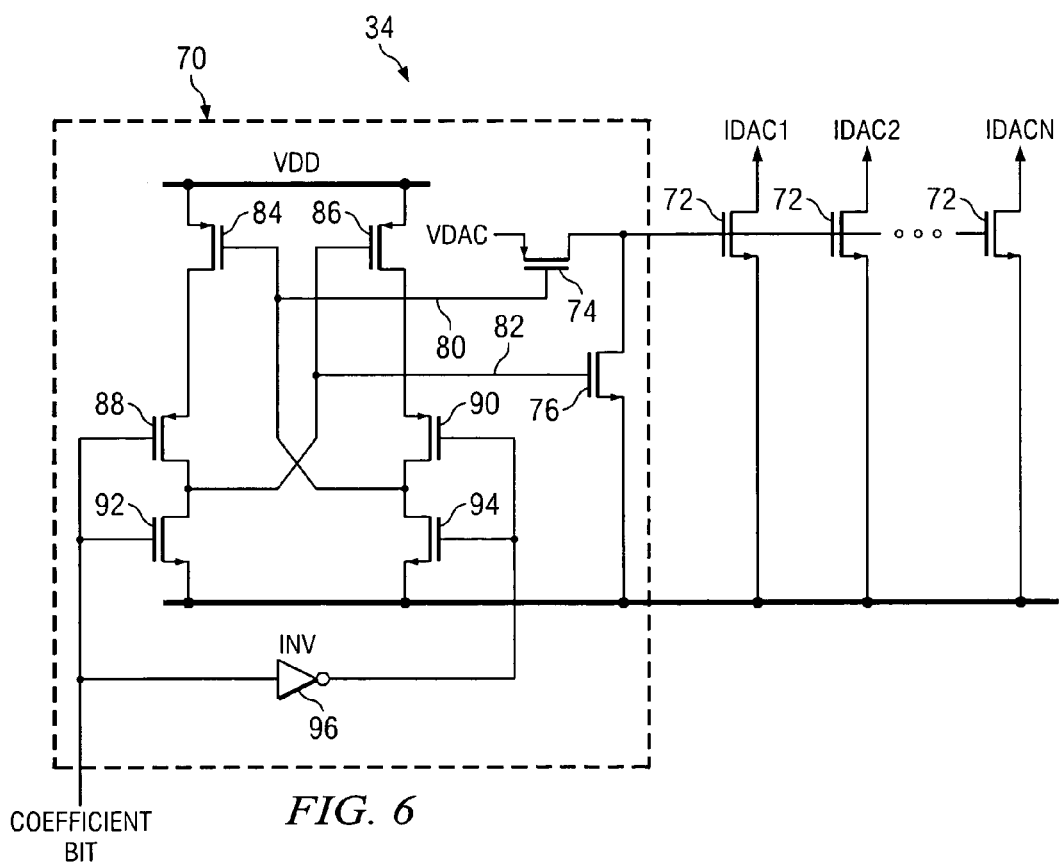
FIG. 6 shows a preferred embodiment of the DAC unit of FIG. 2.

FIG. 6 illustrates an embodiment of the tap DAC unit 34. As shown, the preferred embodiment of the tap DAC unit 34 includes a "break-before-make" switch 70 and a plurality of current source transistors 72 associated with the currents IDAC1, IDAC2, . . . , IDACN. In that it may be preferred to operate the FIR filter in a low voltage application, stacking transistors in the tap multiplication path is preferably avoided. Instead, the current source transistors 72 are turned on and off by controlling the gate voltage via the VDAC signal and transistor 74. However, simply switching off to on or on to off of transistor 74 may temporarily short the bias VDAC voltage to ground and generates glitches at the DAC output. To prevent voltage glitches on VDAC during transition times, a break-before-make switch 70 is included as shown. Two transistor 74 and 76 connected at the gate of the current source function as switches. A two-step process occurs when the coefficient bit transitions from zero to one. First, transistor switch 76 is opened so that the gate of transistor 72 is no longer grounded. Second, transistor switch 74 is closed thereby coupling the gate of transistor 72 to the DAC control voltage VDAC. The transistors 74 and 76 are turned on and off by non-overlapping control signals 80 and 82 which are generated using the circuit comprising six transistors 84, 86, 88, 90, 92 and 94 as well as inverter 96 connected together as shown. Transitions from off to on or on to off in this manner avoids glitches on VDAC and, in turn, prevents glitches in the FIR filter output.

In general, FIR filter and DAC linearity requires constant steps over the entire range of coefficient values. In the preferred embodiment of the FIR filter 30, the DAC output currents are summed at the output node. Accordingly, as more coefficient bits are turned on, the output common mode voltage increases with respect to the supply voltage. This leads to a smaller drain-to-source voltage across the current source transistor 72. Fast switching of the tap multiplication circuit necessitates low capacitance at the current source outputs. In accordance with the preferred embodiment, the current source transistors 72 are implemented as relatively short channel devices.

Unfortunately, short channel devices may suffer from severe channel modulation effects. Typically, a cascode circuit is used to reduce this phenomenon. However, as previously mentioned, a desire for low supply voltage operation prevents additional stacking in the tap multiplication path. Therefore, when the current source output voltage reduces, the output current will also reduce. This effect also reduces the DAC and overall FIR filter linearity. The replica bias circuit 36 is included to overcome this non-ideal DAC behavior.

FIG. 7 shows a preferred embodiment of the replica bias circuit 36. The replica bias circuit functions to provide constant DAC steps regardless of the current source drain-to-source voltage. The IREF current source 100 functions as the DAC reference current. This current sinks into the replica circuit mimicking the tap multiplication and tap DAC current source path. A drain-to-source voltage equal to the DAC current source voltage is forced on the replica path current source through the operational amplifier ("op amp") 102 and FIR filter output common voltage sense loop. In this mode, the replicated path mimics the FIR filter tap unit path. The gate voltage of the current source changes in opposition to the FIR filter output common mode voltage to maintain constant current source output. Moreover, noise superimposed on $V_{DD}$ does not detrimentally effect the tap multiplication process.

While the preferred embodiments of the present invention have been shown and described, modifications thereof can be made by one skilled in the art without departing from the spirit and teachings of the invention. The embodiments described herein are exemplary only, and are not intended to be limiting. Accordingly, the scope of protection is not limited by the description set out above.

What is claimed is:

1. A filter, comprising:
   a tap multiplication circuit that receives sample decisions and equalization coefficients;

a tap digital-to-analog ("DAC") unit coupled to the tap multiplication circuit; and a plurality of clocks that control timing associated with the tap multiplication circuit and that permit one tap multiplication to be output while another tap multiplication is being computed;

wherein said tap multiplication circuit comprises a plurality of tap multiplication units, each tap multiplication unit comprising a first transistor that is controlled to output a tap coefficient current, and a second transistor that is controlled to provide current through a conducting branch that is separate from a branch in which the tap coefficient current is output, wherein the first transistor and the second transistor do not provide current at the same time.

2. The filter of claim 1 wherein the tap DAC unit comprises a break-before-make switch that, when a coefficient bit transitions logic states, precludes a gate of a current source from being grounded and then couples the gate to a control voltage.

3. The filter of claim 1 further comprising a replica bias circuit coupled to the tap multiplication circuit and the DAC unit, the replica bias circuit provides substantially constant DAC steps regardless of variations in voltage associated with a current source in the tap DAC unit.

4. A communication apparatus, comprising:

a summer;

a slicer coupled the summer and that generates sample decisions; and a filter coupled to the slice and the summer that receives equalization coefficients and sample decisions and generates and provides an equalization signal to the summer, the filter comprising a tap multiplication circuit, a tap digital-to-analog ("DAC") unit coupled to the tap multiplication circuit, and a plurality of clocks that control timing associated with the tap multiplication circuit and that permit one tap coefficient to be output while another tap coefficient is being computed, wherein said tap multiplication circuit in the filter comprises a plurality of tap multiplication units, each tap multiplication unit comprising a first transistor that is controlled to output a tap coefficient current, and a second transistor that is controlled to provide current through a conducting branch that is separate from a branch in which the tap coefficient current is output, wherein the first transistor and the second transistor do not provide current at the same time.

5. The apparatus of claim 4 wherein the tap DAC unit comprises a break-before-make switch that, when a coefficient bit transitions logic states, precludes a gate of a current source from being grounded and then couples the gate to a control voltage.

6. The apparatus of claim 4 further comprising a replica bias circuit coupled to the tap multiplication circuit and the DAC unit, the replica bias circuit provides substantially constant DAC steps regardless of variations in voltage associated with a current source in the tap DAC unit.

* * * * *